US007568960B2

(12) United States Patent
Panella et al.

(10) Patent No.: US 7,568,960 B2
(45) Date of Patent: Aug. 4, 2009

(54) CAPACITIVE SIGNAL CONNECTOR

(75) Inventors: Augusto P. Panella, Naperville, IL (US); Robert D. Malucci, Naperville, IL (US)

(73) Assignee: Molex Incorporated, Lisle, IL (US)

( * ) Notice: Subject to any disclaimer, the term of this patent is extended or adjusted under 35 U.S.C. 154(b) by 0 days.

(21) Appl. No.: 12/105,976

(22) Filed: Apr. 18, 2008

(65) Prior Publication Data

US 2008/0299841 A1 Dec. 4, 2008

Related U.S. Application Data

(60) Provisional application No. 60/925,226, filed on Apr. 18, 2007.

(51) Int. Cl.
*G11C 7/00* (2006.01)

(52) U.S. Cl. ........................ 439/886; 257/300; 257/316; 365/200; 365/185.08; 438/591

(58) Field of Classification Search ................. 439/886; 257/300, 316, 315; 365/200, 185.08, 185.28; 438/591
See application file for complete search history.

(56) References Cited

U.S. PATENT DOCUMENTS

| | | | | |
|---|---|---|---|---|
| 6,534,812 | B1 * | 3/2003 | Mukai et al. | 257/300 |
| 6,612,852 | B1 | 9/2003 | Panella | |
| 6,812,517 | B2 * | 11/2004 | Baker | 257/315 |
| 6,933,218 | B1 * | 8/2005 | Lee et al. | 438/591 |
| 2001/0019506 | A1 * | 9/2001 | Chen | 365/200 |
| 2003/0218909 | A1 * | 11/2003 | Terzioglu et al. | 365/185.28 |
| 2005/0111258 | A1 * | 5/2005 | Terzioglu et al. | 365/185.08 |
| 2006/0043464 | A1 * | 3/2006 | Tsunoda et al. | 257/316 |

OTHER PUBLICATIONS

Malucci, R.D. "High Frequency Considerations for Multi-Point Contact Interfaces" Proceedings of the Forty-Fifth IEEE Holm Conference on Electrical Contacts, 2001.

Malucci, R.D., Panella, A.P. "Wave Propagation and High Frequency Signal Transmission across Contact Interfaces" Proceedings of the fiftieth IEEE Holm Conference on Electrical Contacts, 2006.

Malucci, R.D. "Stability and Contact Resistance Failure Criteria" IEEE Transactions on Components and Packaging Technologies, Jun. 2006, vol. 29, No. 2, p. 326-332.

(Continued)

*Primary Examiner*—Gary F. Paumen
(74) *Attorney, Agent, or Firm*—Larry I. Golden

(57) ABSTRACT

The present disclosure is directed to connectors and methods for passing signals through capacitive coupling and electron tunneling. The connectors according to the present disclosure can include contacts that have a dielectric film or coating applied at least at a contact interface area where the contacts engage with the contacts of a complementary mating connector. The contacts of the either or both of the connector and complementary connector can be coated with a dielectric film. The dielectric film can be selected from metal oxides and can be applied using known methods such as vapor deposition methods, oxidative methods, plating methods and adhesive coating methods. Performance parameters such as capacitance and resistance can be selected by selecting the material for the film and the thickness of the dielectric film and provides a contrast between the requirements for high frequency signal transfer using capacitive coupling and electron tunneling versus traditional metallic contact.

30 Claims, 15 Drawing Sheets

OTHER PUBLICATIONS

Holm, "Electric Contacts", Springer-Verlag, New York 1267, p. 52.

Greenwood J.A. "Constriction Resistance and the Real Area of Contact"Proceedings of the 3rd International Research Symposium on Electrical Contact Phenomena, Jun. 1966.

J. Pullen and J.B.P. Williamson, "On the plastic contact of rough surfaces", Proc. R. Soc. Lond. A. 327, p. 159-173 (1972).

Holm, "Electric Contacts", Springer-Verlag, New York Inc. 1967, p. 126, figure 26.11.

Slade, "Electric Contacts", Marcel Dekker, 1999, p. 44.

* cited by examiner

CAPACITIVE SIGNAL CONNECTOR

This application claims the benefit of U.S. Provisional Application Ser. No. 60/925,226 filed on Apr. 18, 2007, which is incorporated herein by reference.

BACKGROUND

The present disclosure is generally directed to connectors for transferring signals using capacitive coupling and electron tunneling. In particular, the connectors disclosed herein are designed to transfer high frequency signals through the contact interface using capacitive coupling as opposed to traditional metallic contact (galvanic) transfer and suffer less or no signal degradation due to corrosion and/or oxidation effects. More specifically, the connectors disclosed herein can have a mating interface that have an insulating coating or film associated with the contact interface In the past, contact resistance and voltage drop have been used to assess the performance of signal and power contacts respectively. Consequently, a great deal of research has been aimed at understanding the physics of contact interfaces in terms of metallic contact area and the impact a loss of contact area has as a system degrades in the field. However, as data rates increase, the propagation of high frequency signals requires transmission lines with sufficient bandwidth to pass the signals with minimal losses and distortion. In these cases, one must consider not only the contact resistance, but also the transmission characteristics of the connector system. This requires understanding the impedance of the connector contact including the contact interface. Consequently, one must know the level of capacitance and inductance introduced by the contact in question. With this knowledge, the impact of the contact upon signal propagation can be estimated.

Resistance and capacitance of typical multi-point contact interfaces have been used to assess the impact on high frequency signal integrity. Finite element field analysis has shown that the impedance of degraded contact interfaces can affect the transmission of high frequency signals. Research also has been done showing the relationship of wave propagation relative to contact interface physics at high frequencies in the frequency and time domains.

In addition, this research has shown that fully degraded contact interfaces can still provide acceptable performance for high frequency and high data rate signal transfers. In the case of a fully degraded contact, signals are transferred by capacitive signal coupling and wave propagation. It has also shown that the low end frequency spectrum may affect the quality of signals with significant low frequency content.

The present disclosure presents the main parameters associated with capacitive coupling of contact interfaces including the physics of the contact interface, methods for applying these parameters to determine the type and thickness of an insulating film to apply to the contact depending on the desired capacitive coupling and electron tunneling properties, and connectors with contacts having an insulating film or coating associated thereto for capacitive as opposed to galvanic coupling for signal transfer. It will be understood that application of the present disclosure to particular fields of use also can require consideration of other factors such as the overall geometric effects of the entire contact structure from one end of the connector path to the other along with transmission line characteristics which can impact signal integrity.

SUMMARY

In one aspect of the present disclosure a connector is provided having a non-galvanic signal interface for carrying both high frequency signal content and low frequency signal content. The connector includes a first contact for engaging with a second contact of a complementary mating connector at a predetermined contact force, and at least one of the first and second contact having a dielectric film at an area of engagement between the first and second contact such that a thickness of the dielectric film between the first and second contact at the area of engagement is a predetermined thickness for providing capacitive coupling for said high frequency signal content and allowing electronic tunneling for said low frequency signal content.

In another aspect of the present disclosure a signal connector is provided. The signal connector includes at least one contact having a contact interface area for engaging with a bare metal contact of a complementary connector at a predetermined contact force. The at least one contact has a dielectric film coating having a predetermined thickness at the contact interface for providing capacitive coupling for high frequency signal content and allowing electronic tunneling for low frequency signal content.

In yet another aspect of the present disclosure a connector assembly for passing signals via capacitive interface is provided. The connector assembly includes a first connector including at least one first contact for engaging at least one second contact of a second mating connector at a predetermined contact force. The first contact has a first dielectric film applied thereto and the second contact has a second dielectric applied thereto. The first dielectric has a first thickness and the second dielectric has a second thickness.

In another aspect of the present disclosure a method of non-galvanic signal transfer through mated connectors by capacitive coupling is provided. The method includes the steps of providing a connector having at least a first contact for engaging with a second contact of a complementary mating connector at a predetermined contact force and providing a dielectric film to at least one of the first and second contacts at an area of engagement between the first and second contact such that a combined thickness of the dielectric film between the first and second contact at the area of engagement has a predetermined thickness for providing capacitive coupling for said high frequency signal content and allowing electronic tunneling for said low frequency signal content.

DETAILED DESCRIPTION

It is to be understood that the disclosed embodiments are merely exemplary of the disclosure, which may be embodied in various forms. Therefore, specific details disclosed herein are not to be interpreted as limiting, but merely as a representative basis for teaching one skilled in the art to variously employ the inventive features herein disclosed in virtually any appropriate manner.

In the case of traditional connector contacts, resistance of the contacts is typically considered a fundamental quantity in both signal and power applications. It is well known that stable metallic contact at the interface of engaging contacts (contact interface) is necessary for a connector system to perform reliably in the field. In the case of signal connectors, it has been seen that as a contact ages, resistance of the contact can increase. In traditional connector systems, it is commonly held that keeping the change in contact resistance below a specific level (usually 10-20 milliohms) minimally impacts electrical stability. For traditional power connectors, it is commonly held that voltage drop at rated current should be kept below a specific change (usually 10-30 millivolts). However, as data transfer rates increase, the frequency content of the signals increase. Accordingly, impedance (and how it changes) must be considered in defining performance as the connector ages and electrical parameters such as capacitance and inductance must be characterized in terms of the connector design and contact physics of the interface. This can require adding a new dimension to the analysis to evaluate performance. Before moving ahead, a basic understanding of the contact interface and contact resistance is in order.

Figure 1:
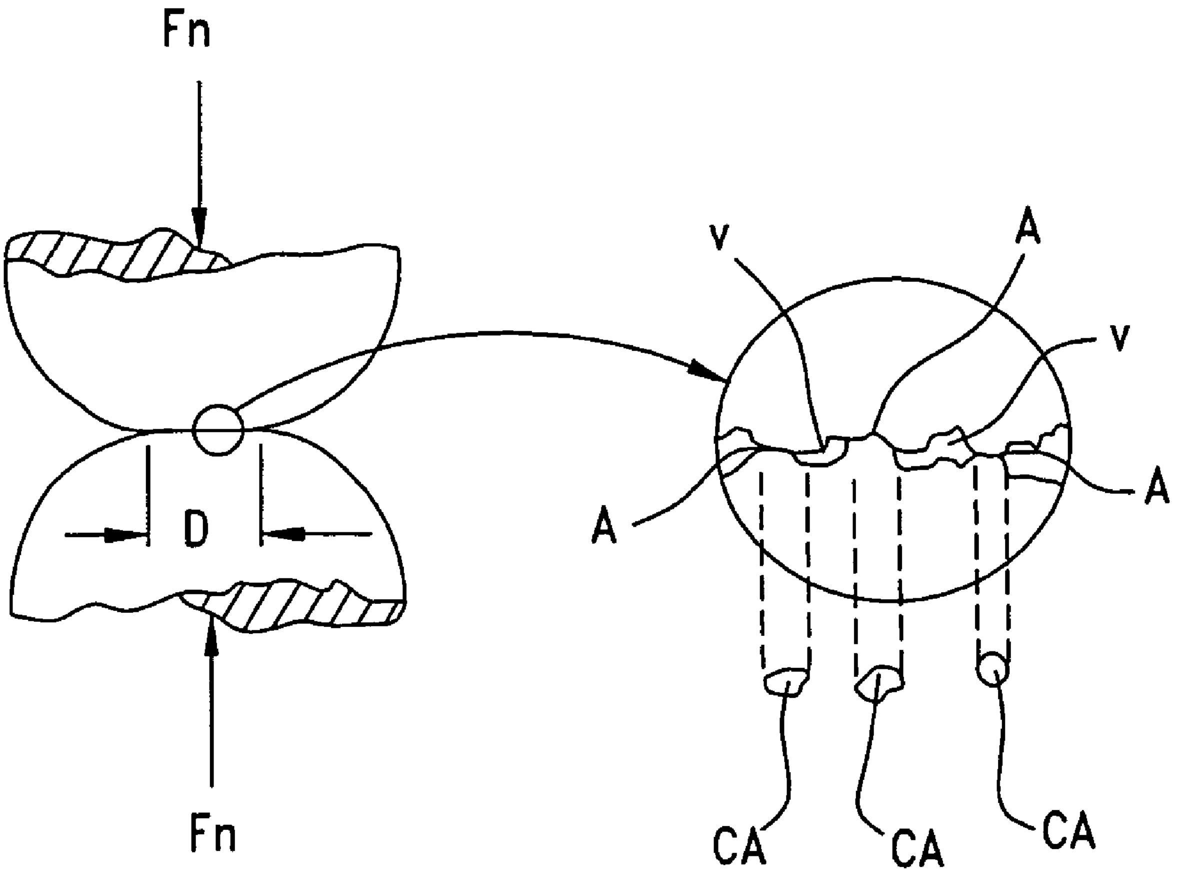
FIG. 1 shows a schematic of the contact interface area of contact to contact engagement.

It is well known that contact resistance can depend on a number of design features and material properties. Properties such as, resistivity, micro hardness, contact force, contact shape, modulus of elasticity and surface roughness can have an impact on how metallic contact is made at the interface of engaging contacts and what level of contact resistance occurs. FIG. 1 shows a schematic of the essential features of an assumed contact interface. As two surfaces come in contact under load shown as ‘Fn’, the high spots or constrictions ‘A’ form asperity contacts or contact spots, in the contact region ‘D’ defined by the contact geometry. The cross-sectional area of the contact spots ‘A’ is shown as ‘CA’ in FIG. 1. In addition, the type of plating and the mechanical stability of the contact spring play are factors as a system ages due to various stresses in the field. In general, if corrosion, oxidation, loss of contact force and motion occur at the interface, the contact can become unstable with time and reduce system performance. Consequently, an understanding of the relation of the above parameters to contact resistance is necessary in understanding how to design a stable connector system. A simple general model has been proposed to estimate the impact of these parameters on contact resistance. Typically the model for contact resistance, Rc, is shown in the following equation 1:

$$R_c \cong \rho_b/D + \rho_e/nd \quad (1)$$

Where $\rho_b$ and $\rho_e$ are the resistivities of the bulk contact and plating materials, respectively. D is the apparent contact diameter due to the contact shape and elastic loading of the base metal and n is the number of asperity contacts with average spot diameter d. Equation 1 is only an approximation and assumes the micro contact spots are circular and spaced so that long constrictions occur. In addition, it is assumed the constriction due to D is primarily in the bulk contact material while the micro contact constrictions occur in the surface layer. A more detailed equation has been provided where the interaction of the micro contacts was addressed. However, the difference between equation 1 and the latter was shown to be less than 10%. Consequently, the simpler and more easy to use equation 1 shown above can be used in the present analysis. However, although the above equation looks relatively simple, it is actually very complicated when one considers how D, n and d are formed due to material properties.

D is essentially the result of contact geometry and a complicated elastic loading of the bulk contact materials. In this analysis, Hertz contact theory is applied to an assumed sphere on flat surface to estimate the value of D. In addition, the number and size of the real contact spots (n and d) are dependent upon the micro-hardness of the plating and surface roughness of the interface. It is assumed that primarily plastic deformation occurs at the asperity level and this provides the number and size of the asperity as a result of the hardness of the surface layer. In the case of base metal contacts, some of these spots may have insulating films that cause poor conductivity. In addition, as a contact ages, the second term, i.e. Pb, in above equation 1 changes due to loss of real metallic contact area. Consequently, as a contact ages it may lose metallic contact spots as insulating films form at the interface. This can cause high resistance and instability. Although shown as a spherical contact, it should be noted that any contact area can support a capacitive interface.

Figure 2:
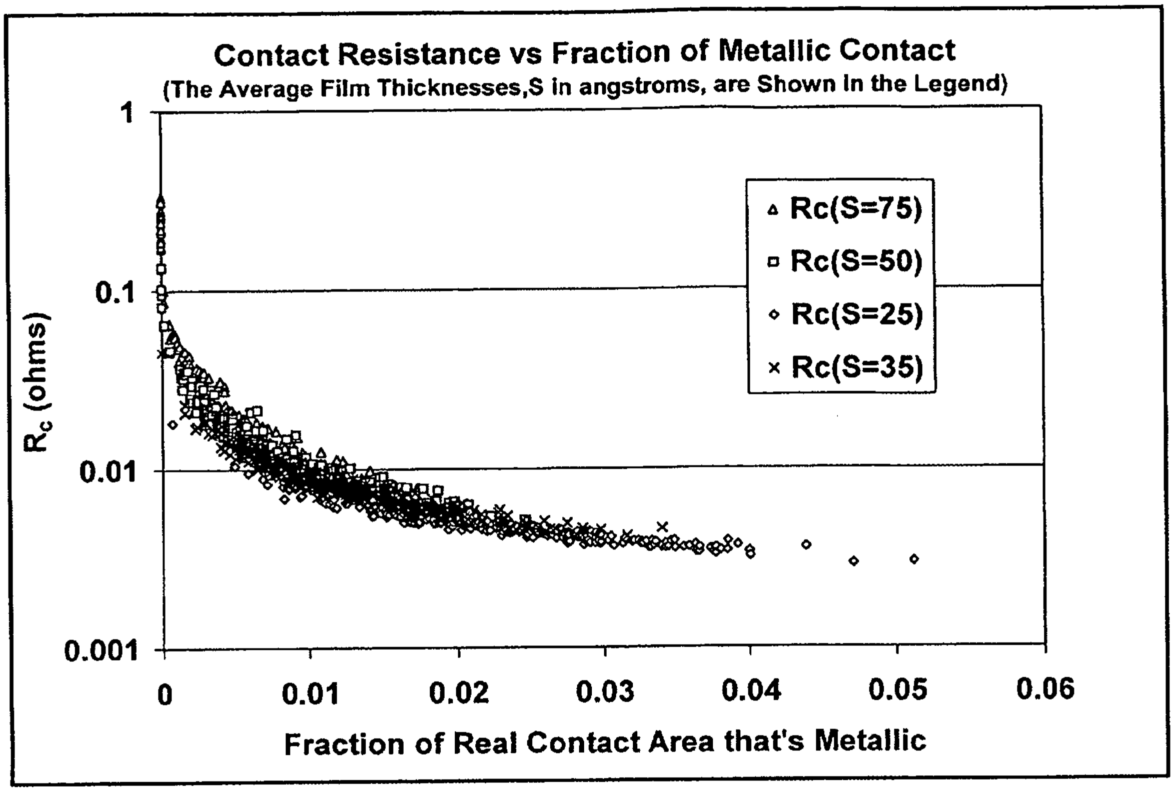
FIG. 2 shows a Monte Carlo analysis of contact resistance vs. metallic contact of the model shown in FIG. 1.

FIG. 2 shows the results of a Monte Carlo analysis using a model similar to equation 1. However, equation 1 was modified to include the effects of films which were allowed to occur randomly on the surface. The details of this analysis can be obtained in Malucci, R. D. “Stability and Contact Resistance Failure Criteria” IEEE Transactions on Components and Packaging Technologies, June 2006, Vol. 29, No. 2, p. 326-332, the entirety of which is incorporated herein by reference. FIG. 2 shows that as metallic contact is lost, the resistance increases above the 10 milliohm level when metallic contact falls below 1%. Moreover, after about 50 milliohms the contact becomes non-metallic and conduction occurs by tunneling and capacitive coupling.

Figure 3:
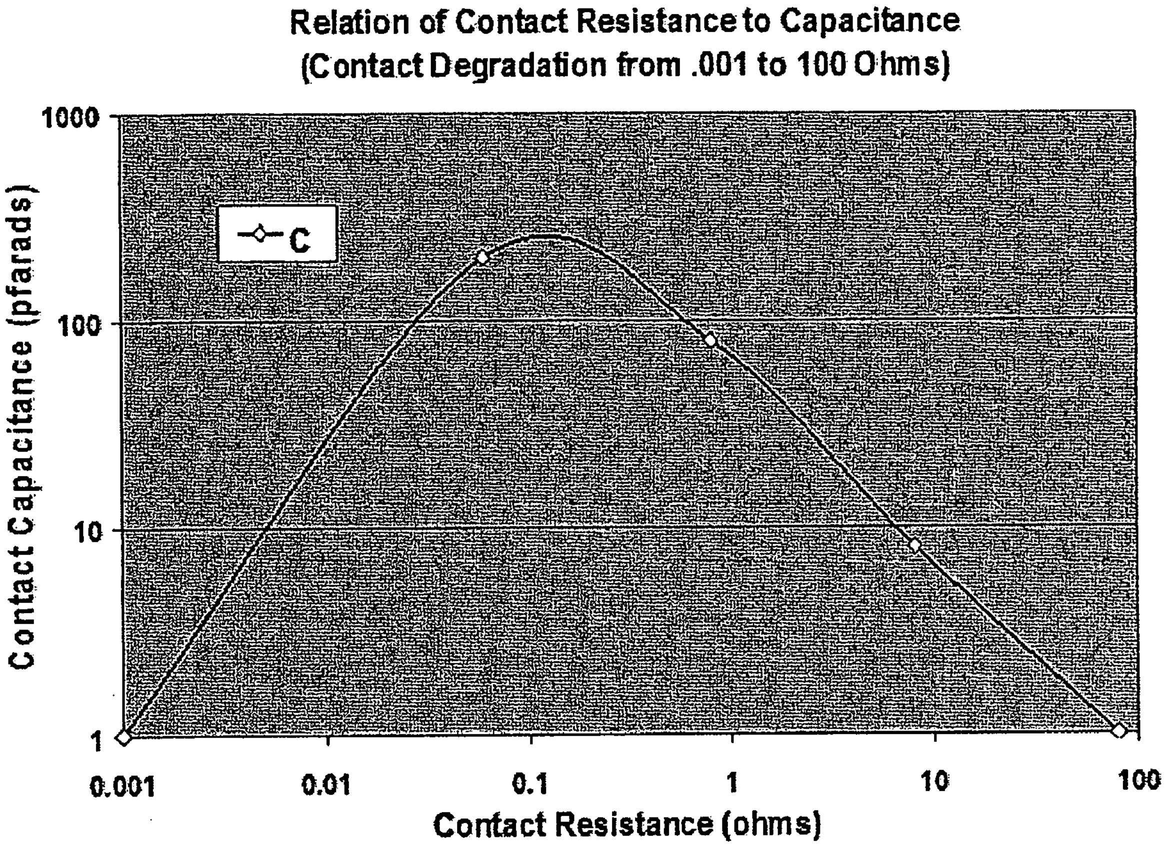
FIG. 3 shows the relation of contact resistance to capacitance of a degrading base metal contact.

The capacitance of a degrading base metal (brass) contact was analyzed in Malucci, R. D. “High Frequency Considerations for Multi-Point Contact Interfaces” Proceedings of the Forty-Fifth IEEE Holm Conference on Electrical Contacts, 2001, the entirety of which is incorporated by reference. The results as illustrated in FIG. 3 in which a 100 gram force was applied to the contacts show the contact capacitance increasing as the contact resistance increases due to copper oxide film formation. This occurs until the whole contact is covered by an insulating film. Subsequently, after the contact is fully covered, the contact film increases in thickness due to aging by oxidation and/or corrosion processes and the capacitance decreases accordingly. Consequently, it was seen from this analysis that as the film increases in thickness the contact interface becomes capacitively coupled. The impact of insulative film formation was also shown in Malucci, R. D., Panella, A. P. "Wave Propagation and High Frequency Signal Transmission across Contact Interfaces" Proceedings of the fiftieth IEEE Holm Conference on Electrical Contacts, 2006, the entirety of which is incorporated herein by reference. It was found that up to a point, where the contact capacitance was effective, high frequency signals were not significantly affected as the contacts degraded.

Providing connectors having contacts that can include a film or coating of an insulation, dielectric or non-conductive material at least at the contact interface area can utilize capacitive coupling for stable electrical connections. In addition, by including a film or coating on contacts certain design parameters can be adjusted and further degradation or oxidation of the contacts can be lessened. The film or coating can be applied in a manner that is resistant to removal through normal wiping between contacts that can occur during repeated connection and disconnection of the connectors.

The electrical performance of the connector can be tuned by selecting the type and thickness of the coating or film material on the contacts. The impact of the type and thickness of the film on capacitance and other electrical parameters such as electron tunneling can now be discussed.

Contact capacitance can depend primarily on three features: contact geometry, the amount of real physical contact where dielectric films have grown and the amount of microvoids in the contact regions where air or some other dielectric material is trapped at the interface. FIG. 1 shows cross-section 'C' of a contact region that explicitly shows these features. As seen, there are contact spots where film is assumed to be sandwiched between the metal contact members. These films may be the result of aging or may have been purposely put on the surface to provide capacitive coupling. In addition, voids 'V' are shown, which are assumed to contain normal air and provide areas that contribute to capacitance. In the following analysis, these two types of contributions to capacitance are considered in terms of contact design. Also, the three dimensional geometry (shape) of the contact in the physical contact region can contribute to capacitance. In this analysis, as the path length across the interface is very short, the inductance is typically very small and is not expected to impact the analysis significantly. Consequently, the focus will be on the impact contact capacitance has on signal transfer performance. From this point forward we will estimate the dependence of contact capacitance from the aforementioned features by assuming the micro-capacitors are irregularly shaped parallel plate capacitors.

As a starting point, the equation for the capacitance of a parallel plate capacitor is considered and the fringe fields can be neglected. This is given by the following equation 2:

$$C=A\in/t$$

Where, C is the capacitance, A the surface area of the capacitor and $\in$ the dielectric constant of the film of thickness t that is sandwiched between the parallel metallic plates. In the multi-spot model, there will be many capacitors in parallel. In this case, the total capacitance of the interface ($C_T$) will be the sum of the individual micro-capacitors ($C_i$) as shown in equation 3 as follows:

$$C_T=\Sigma C_i=\Sigma(A_i\in_i/t_i) \quad (3)$$

This provides an estimate of the total capacitance of the interface. The sum in equation 3 breaks up into two cases where the dielectric constant is different. First, where a thin film is sandwiched between metal asperity contacts (real physical contact spots) and second, where the voids occur between the asperity contacts. In the case of the thin film, the dielectric film thickness will be assumed constant. However, in the voids the dielectric thickness varies according to the surface roughness. Consequently, in the latter case, an average effect is estimated by integrating over the surface, which was done Malucci, R. D. "High Frequency Considerations for Multi-Point Contact Interfaces" by statistically averaging the term under the sum in equation 3. With these considerations, the contact capacitance can be written as, $$C_T=C_f+vC_v$$

Where the capacitance due to a film thickness of t at the asperity contacts is $C_f=\in_f A_r/2t$. Here t is the film thickness on each side of the asperity contacts, $\in_f$ is the dielectric constant of the film and $A_r$ is the real area of contact. The void contribution is given as $C_v=\in_v(1-A_r)<½$, where $\in_v$ is the void dielectric constant, $(1-A_r)$ is the void area and $<½t>$ is the statistical average of the inverse separation of the void surfaces. In the latter case as shown in Malucci, R. D. "High Frequency Considerations for Multi-Point Contact Interfaces", the average of ½t in the brackets was calculated using statistical methods and FIG. 4 shows a plot where the resistance and capacitance of a clean contact is shown as a function of contact force.

Figure 4:
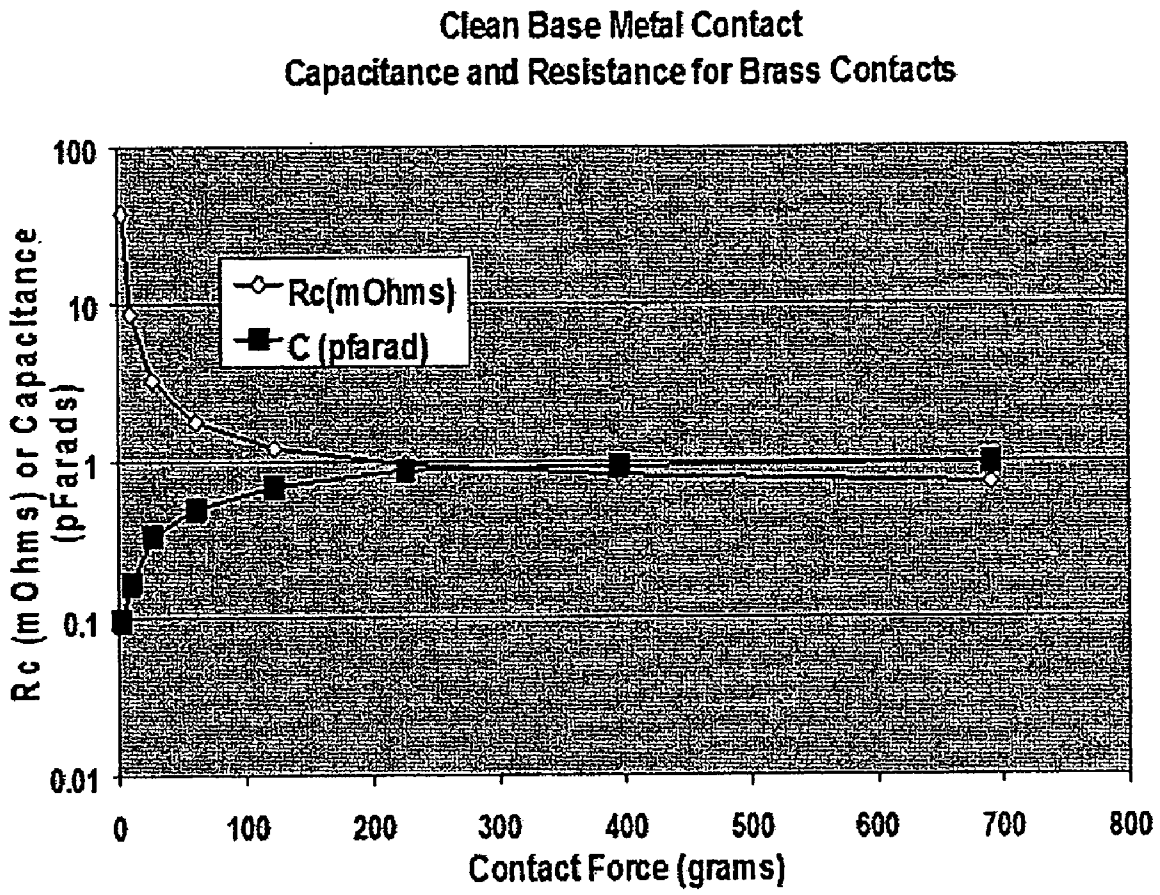
FIG. 4 shows the resistance and capacitance of a clean metal contact as a function of contact force.

As seen in FIG. 4, the resistance decreases and the capacitance increases as the force increases. Moreover, the capacitance in this case is the capacitance due to the void as there was no film at the real points of contacts. This shows that the void capacitance is expected to be very small in typical contacts. This same procedure was followed in producing the plot of a film covered contact in FIG. 3.

As seen earlier in FIG. 3, if the film grows at the interface, a substantial capacitance can occur as the contact spots become covered with a very thin film. Subsequently, the capacitance decreases as the film continues to grow in thickness. FIG. 3 shows two features of film covered contacts. First the resistance and capacitance goes up as the film thickness grows after which the capacitance goes down if the film continues to thicken. Accordingly, the contact interface to provide both high frequency capacitive coupling and reasonable tunneling resistance to pass low frequency or DC components can be optimized through selection of the thickness of the film.

By neglecting the contributions from the voids and contact shape, an estimate of capacitance and resistance for film covered contacts can be made by using the following equations 4 and 5 respectively as follows:

$$C_f=\in_f A_r/2t \quad (4)$$

$$R_f=\sigma(2t)/A_r \quad (5)$$

In equation 5, $A_r$ is the real area of contact, σ is the tunnel resistivity for a film of thickness 2t, which is the total thickness of the film at the contact interface area. In other words, if each of the engaging contacts of the mating connectors has a film of thickness t, total thickness of 2t would result at the contact interface area. Alternatively, the same film thickness of 2t can be applied entirely to the contact of only one of the mating connectors. Since tunnel resistivity can be sensitive to film thickness, it will be seen that thickness can be a factor in designing an interface for high data rate signal transfer. Equations 4 and 5 can be used to estimate the capacitance and resistance of a film covered contact. This can be done by selecting a specific film thickness and estimating the real area of contact from the micro-hardness of the surface layer. The latter is accomplished using the following equation 6 derived from J. Pullen and J. B. P. Williamson, "On the plastic contact of rough surfaces", Proc. R. Soc. Lond. A. 327, 159-173 (1972) for plastic asperity deformation between two rough surfaces.

$$A_r=(F/H)/(1+F/A_nH) \qquad (6)$$

Where F is the contact force, H the micro-hardness of the surface and $A_n$ the apparent contact region where asperity contact is possible. Combining equation 6 with equations 4 and 5 leads to the following equations for capacitance and resistance:

$$C_f=\in_f F/2t(H+F/A_n);\text{ and}$$

$$R_f=\sigma(2t)(H/F+1/A_n);$$

Figure 5A:
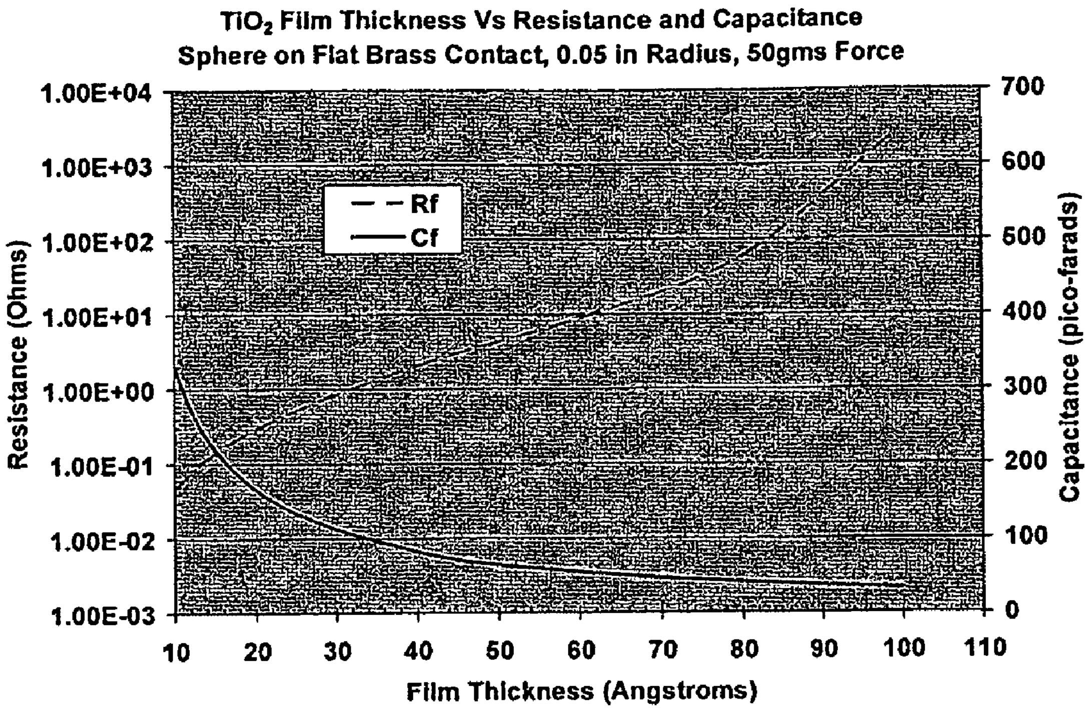
FIG. 5*a* shows the capacitance and resistance for a typical spherically shaped contact with 50 grams of force for $TiO_2$ (titanium oxide) film.
Figure 5B:
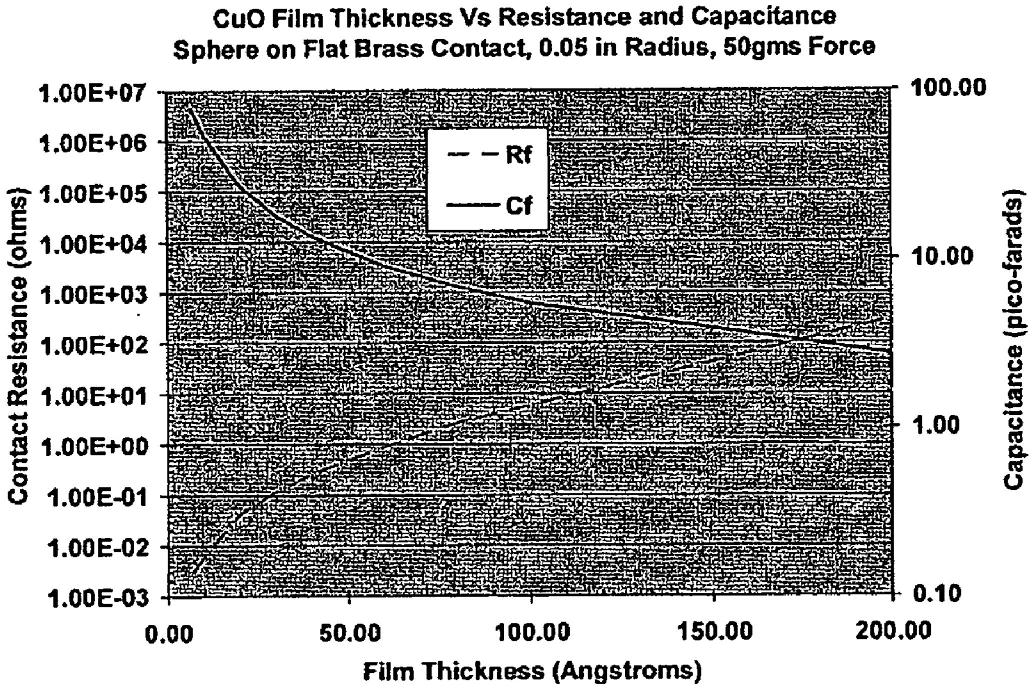
FIG. 5*b* shows the capacitance and resistance for a typical spherically shaped contact with 50 grams of force for $Cu_2O$ (Copper oxide) film.

With these considerations, equations 4 and 5 were used to plot Rf and Cf. FIGS. 5*a* and 5*b* show the results for a typical spherically shaped contact with 0.11 lb (50 gms) of force for $TiO_2$ (titanium oxide) and $Cu_2O$ (copper oxide) films respectively. The tunnel resistivity for $TiO_2$ and $Cu_2O$ films as a function of film thickness, were obtained from Holm, "Electric Contacts", Springer-Verlag, New York Inc. 1967, page 126 figure 26.11 and Slade, "Electric Contacts", Marcel Dekker, 1999, page 44, respectively. As seen, these types of plots permit one to select both the tunneling resistance and capacitance for a given film type and thickness. Such plots can be prepared for other film materials to provide comparable information for selecting the effective thickness for that film material. Consequently, this approach allows one to design a capacitive coupled interface for a given film type.

As seen in FIGS. 5*a* and 5*b*, the $TiO_2$ film provides higher capacitance and higher resistance at 50 Angstroms than does the $Cu_2O$ film. Consequently, there are trade-offs when choosing film materials as high capacitance and low resistance are desirable. In addition, there are other considerations such as film thickness stability, durability and corrosion resistance. The $TiO_2$ film might be expected to wear better and be more corrosion resistant than the $Cu_2O$ for a given thickness even though it produces a higher tunneling resistance. Other films such as any of the chromium oxides or aluminum oxides can also be used. In addition, combinations of metal oxides can be used. The films also can be selected from a variety of insulation or dielectric materials.

The films can be applied by known deposition methods such as vapor deposition and oxidative deposition. The contacts or at least the contact interface area can even be exposed to an oxidative agent or have an oxidative agent applied to the area. Known plating methods can also be utilized as well as adhesive coating methods. In addition, methods for applying polymeric films to substrates can be used.

Once the type and thickness of the film is determined, the full thickness of the film or coating can be applied to the contacts of one of the mating connectors. The film or coating can entirely cover each contact, the exposed area of the contact or only the area of contact interface. Alternatively, the film or coating can be applied to the contacts of both mating connectors in any proportion such that the contact interface area of each contact of the mated connectors has the total desired thickness of the film or coating. In one embodiment half the desired thickness of the film or coating material can be applied to the contact interface area of each contact of a pair of mating connectors.

Figure 6A:
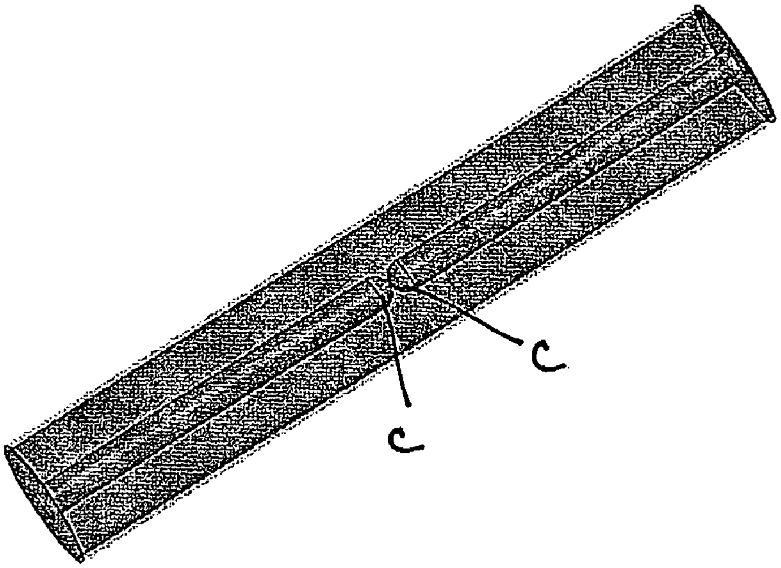
FIG. 6*a* shows a three dimensional coaxial model.
Figure 6B:
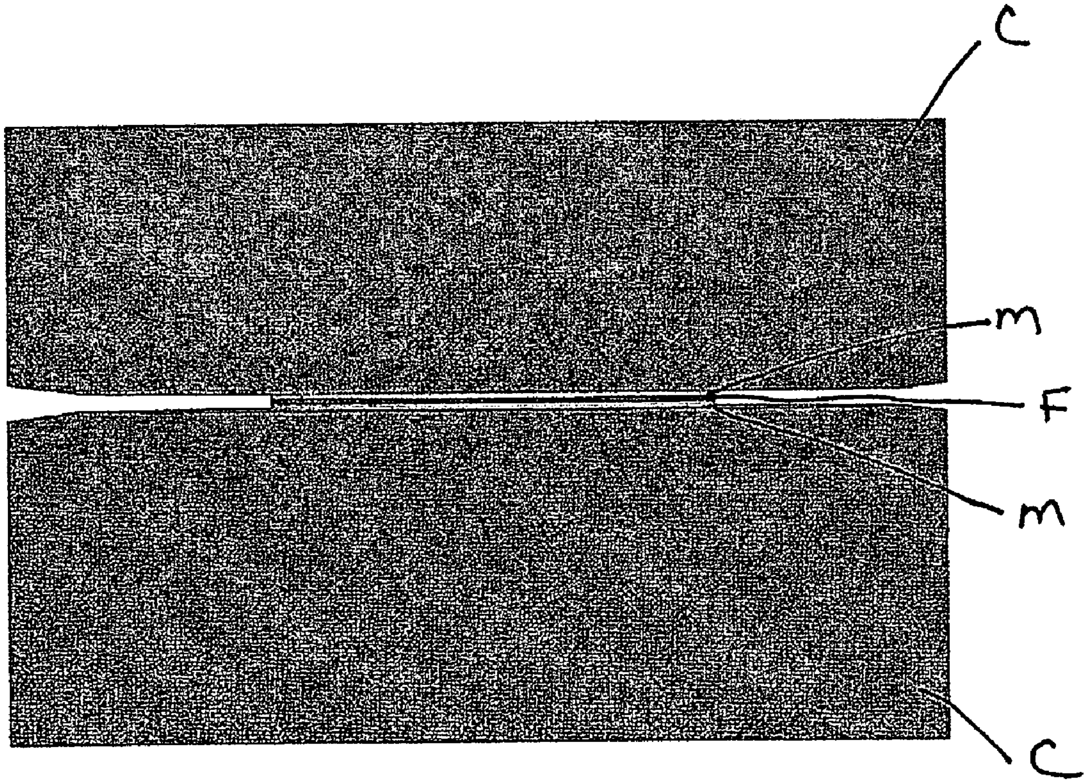
FIG. 6*b* shows a close up of the contact spot at the interface of the coaxial model shown in FIG. 6*a*.

Finite Element Model (FEM) can be used to understand the impact these films have on electrical performance. In particular, FEM was used to simulate a full wave field analysis to evaluate the high frequency performance of various contact cases. The model used in the FEM analysis is shown in FIGS. 6*a* and 6*b*. As shown in FIG. 6*a*, a three dimensional coaxial model was used to incorporate the contact interface into a 50 ohm transmission line. FIG. 6*b* shows a close up of the contact spot at the interface of the coaxial model shown in FIG. 6*a*. Generally, the contact was modeled as a dielectric film 'F' sandwiched between two very thin parallel metallic plates 'M' that are attached to the spherical contact ends. In this analysis, values for resistance, inductance and capacitance were incorporated into the analysis. Consequently, specific values of $R_f$ and $C_f$ were chosen from the type of data as shown in FIGS. 5*a* and 5*b*. Subsequently, based on the choice of $R_f$ and $C_f$, the values of film thickness, tunnel conductivity and dielectric constant were incorporated into the finite element model to conduct full wave analyses. In this case, since the real area of contact was about 28% of the apparent area, a choice was made to model the film covered contact spot to the size of a spot having the real area of contact. Thus the film was modeled to cover the entire contact spot with a thickness as dictated by the choice of $R_f$ and $C_f$ as taken from FIGS. 5*a* and 5*b*. This approach provides a spot size that is smaller than the apparent contact size but provides the level of film resistance and capacitance expected in these cases. In order to get a spot size closer to the apparent size, one would have to overly complicate the finite element model in the contact region by allowing only 28% of the region to be in real contact. This would unnecessarily complicate the simulation, as it is believed this will not impact the results significantly.

Figure 6C:
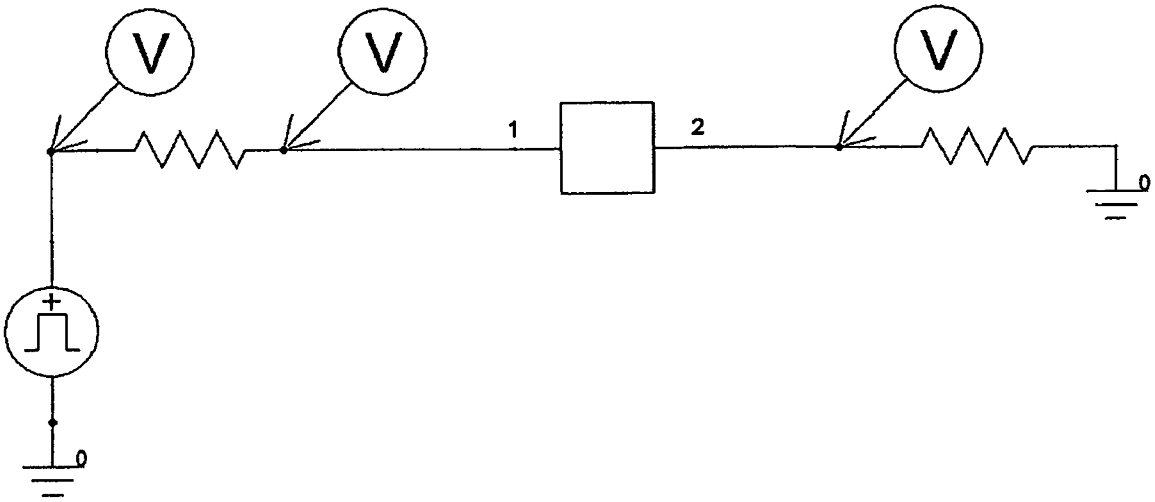
FIG. 6*c* shows a time domain schematic reference of the coaxial model shown in FIGS. 6*a* and 6*b* placed between Ports 1 and 2.

FIG. 6*c* shows time domain schematic reference of the coaxial model shown in FIGS. 6*a* and 6*b*. As shown in FIG. 6*c*, the simulation was conducted by launching high frequency signals from the left through ports 1 and 2 respectively. The coaxial model shown in FIGS. 6*a* and 6*b* is positioned between ports 1 and 2 This enabled the measure of insertion loss (IL) and return loss (RL) after the signal passed through the interface. In addition, this set up allowed measurements to be made in both the frequency and time domain as discussed later.

Figure 7A:
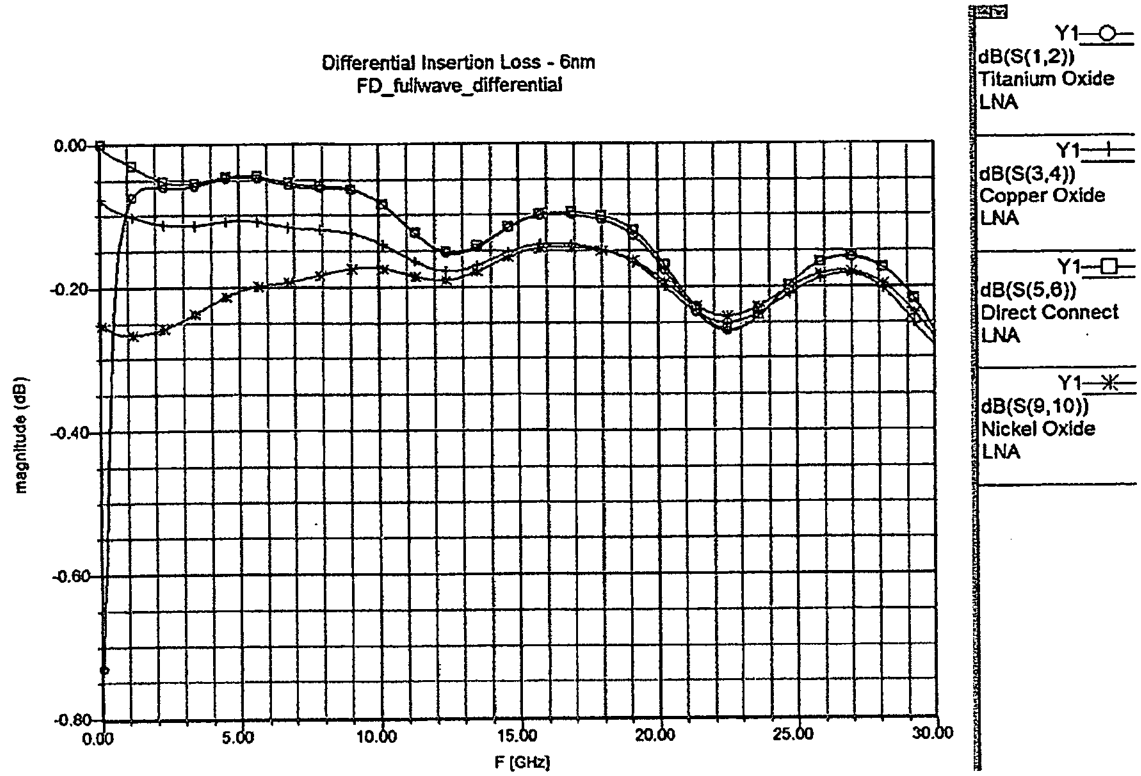
FIG. 7*a* shows the results for insertion loss in the frequency domain for a variety of 6 nm thick dielectric films and bare contacts.
Figure 7B:
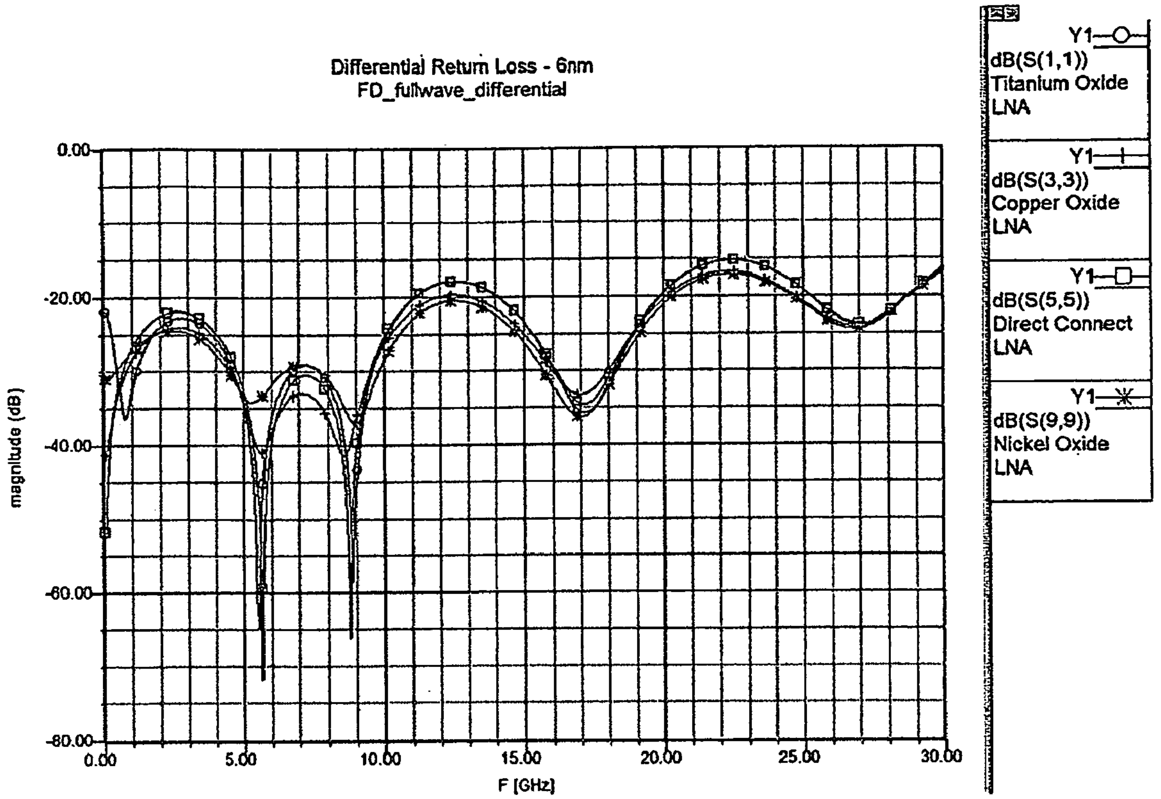
FIG. 7*b* shows the results for return loss in the frequency domain for a variety of 6 nm thick dielectric films and bare contacts.

FIG. 7*a* shows the results for insertion loss and FIG. 7*b* shows the results for return loss in the frequency domain obtained from this study. As seen in FIGS. 7*a* and 7*b*, the low end of the frequency spectrum which can be less than about 2 GHz can be affected by imperfect coupling, while the high end, which can be greater than or equal to about 2 GHz may not. The low frequency results could impact time domain signals as shown below. FIGS. 7*a* and 7*b* provide a comparison of a variety of metal oxides with film thickness of about 6 nm. In addition, a run was made where the interface was pure copper. The latter results are labeled "direct connect" and show the performance expected for metallic contact.

Figure 8A:
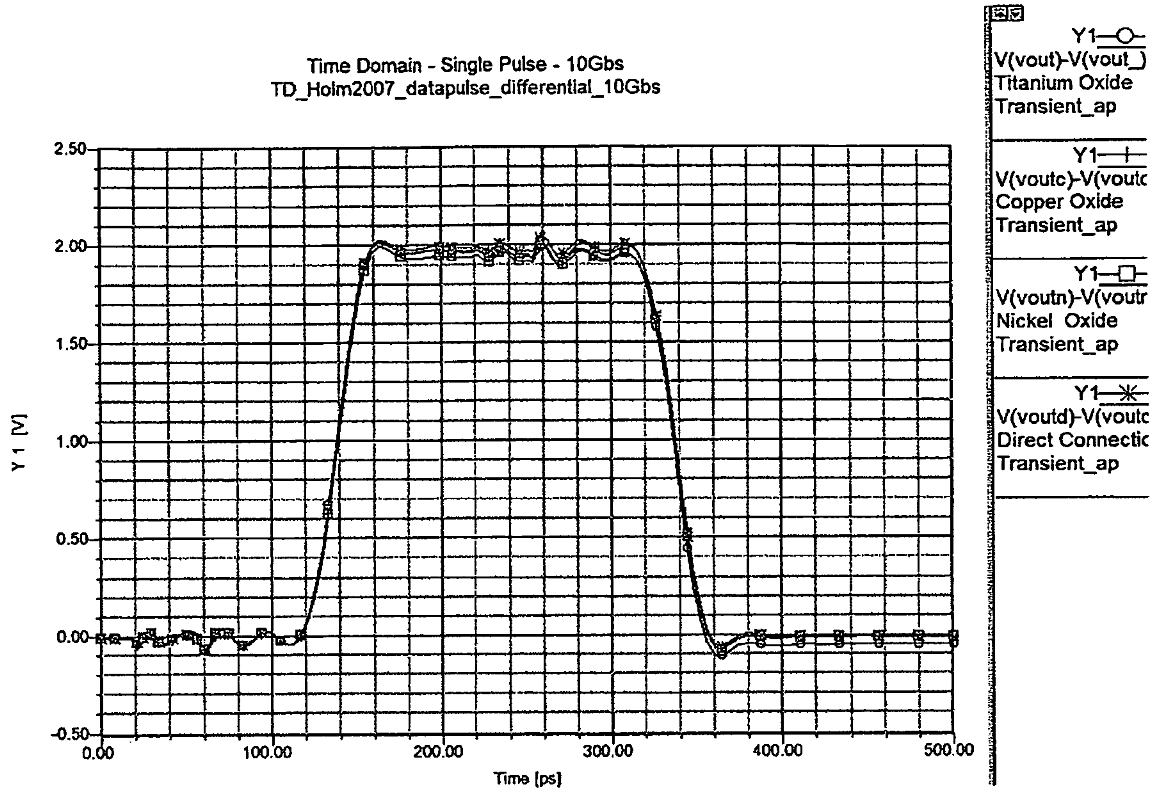
FIG. 8*a* shows the results for insertion loss in the time domain for a variety of 6 nm thick dielectric films and bare contacts.
Figure 8B:
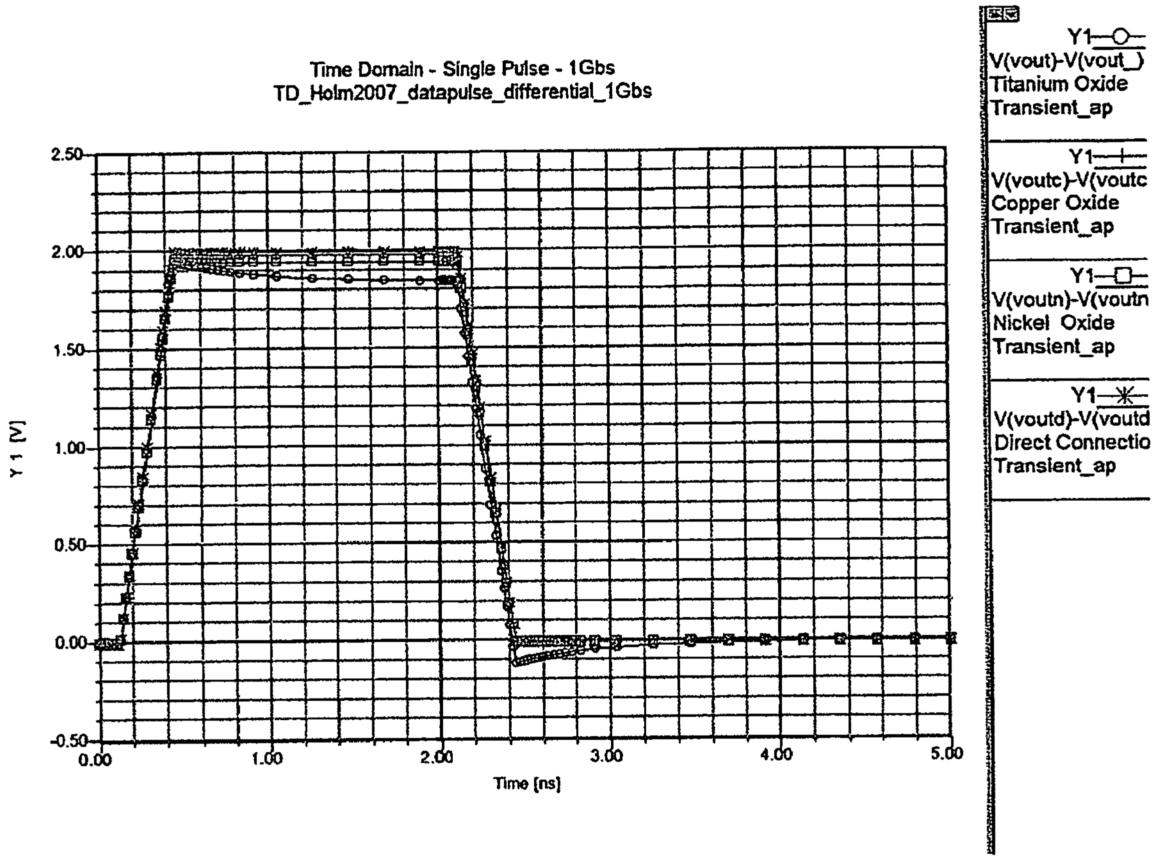
FIG. 8*b* shows the results for return loss in the time domain for a variety of 6 nm thick dielectric films and bare contacts.

The analysis was repeated for about 10 Gb/s single pulse as shown in FIG. 8*a* and for about 1 Gb/s single pulse as shown in FIG. 8*b*. As one can see, each film type can exhibit small deviations from the metallic case at the low frequency end of the plot. All of these cases can exhibit good performance and can be expected to perform well, as shown in the time domain plots in FIGS. 8*a* and 8*b*. As shown in FIGS. 8*a* and 8*b*, both high, which can be about 10 Gbs and low, which can be about 1 Gbs data rate signals are evaluated. It is seen that the lower data rate signal is affected slightly more than the high data rate case. This is a result of the low frequency performance shown in FIGS. 7*a* and 7*b*. In looking at the features in FIGS. 7*a* and 7*b*, it is noted at low frequencies the curves can diverge while at the high frequencies they can converge. The low frequency performance reflects the level of DC coupling that can occur as a result of the conductivity of the film; while at high frequencies the convergence can be a result of capacitive coupling. Consequently, it is shown how the two features of tunneling and capacitance impact performance over the frequency spectrum.

Figure 9A:
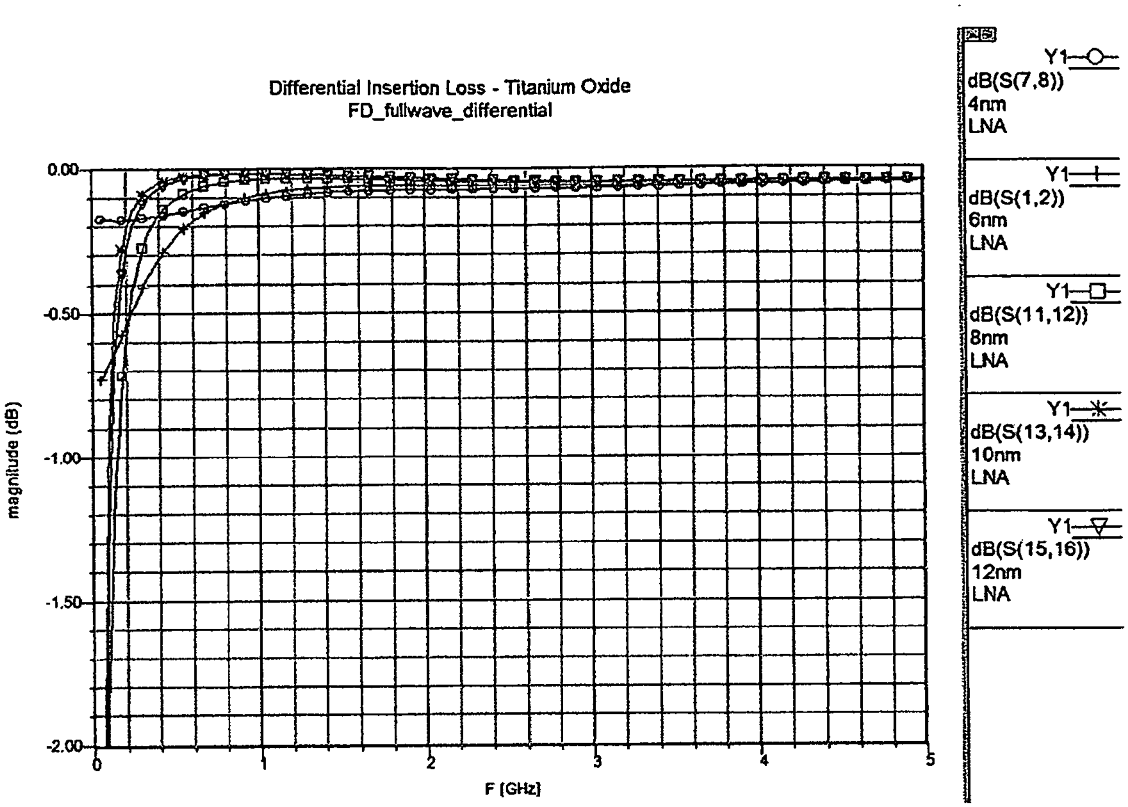
FIG. 9*a* shows the results for insertion loss in the frequency domain for titanium dioxide film at a variety of thickness.
Figure 9B:
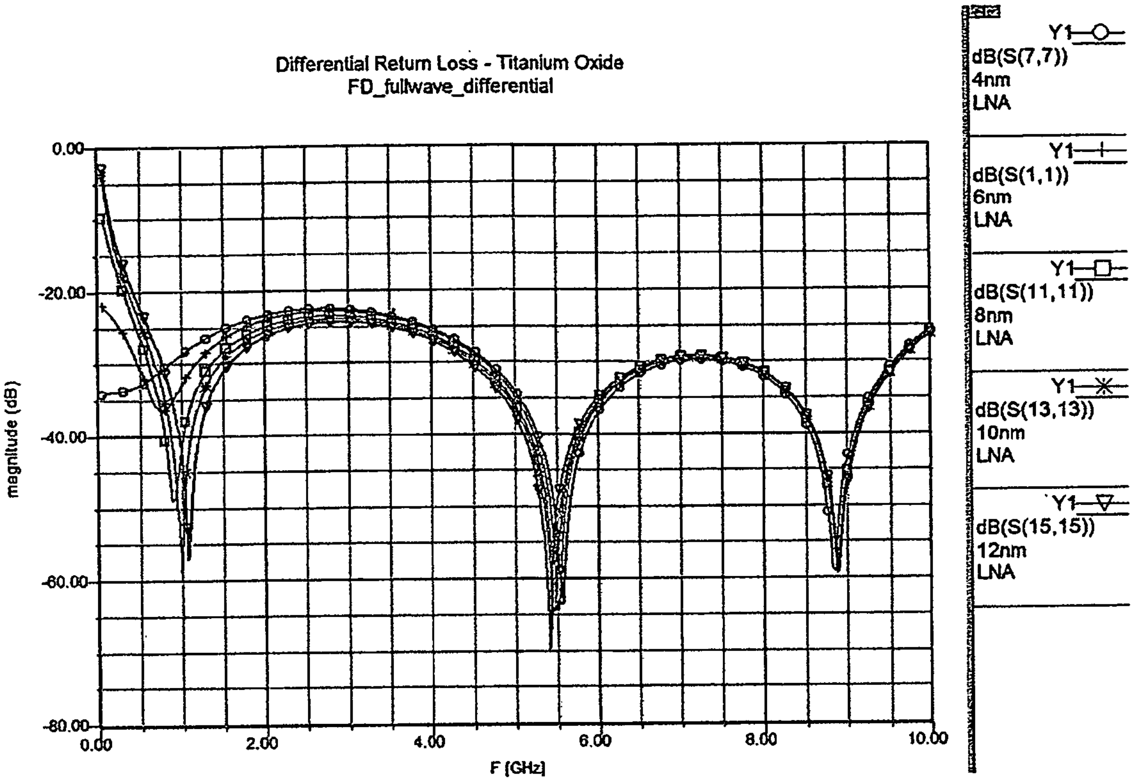
FIG. 9*b* shows the results for return loss in the frequency domain for titanium dioxide film at a variety of thickness.

FIGS. 9*a* and 9*b* show a comparison of $TiO_2$ at various film thicknesses at insertion loss and return loss, respectively. It should be noted, that as the film increases in thickness, the tunneling conductivity increases and the capacitance decreases. Consequently, the coupling weakens as seen in both the frequency and time domain results. FIGS. 9*a* and 9*b* show greater attenuation and reflection as the film gets thicker.

Figure 10A:
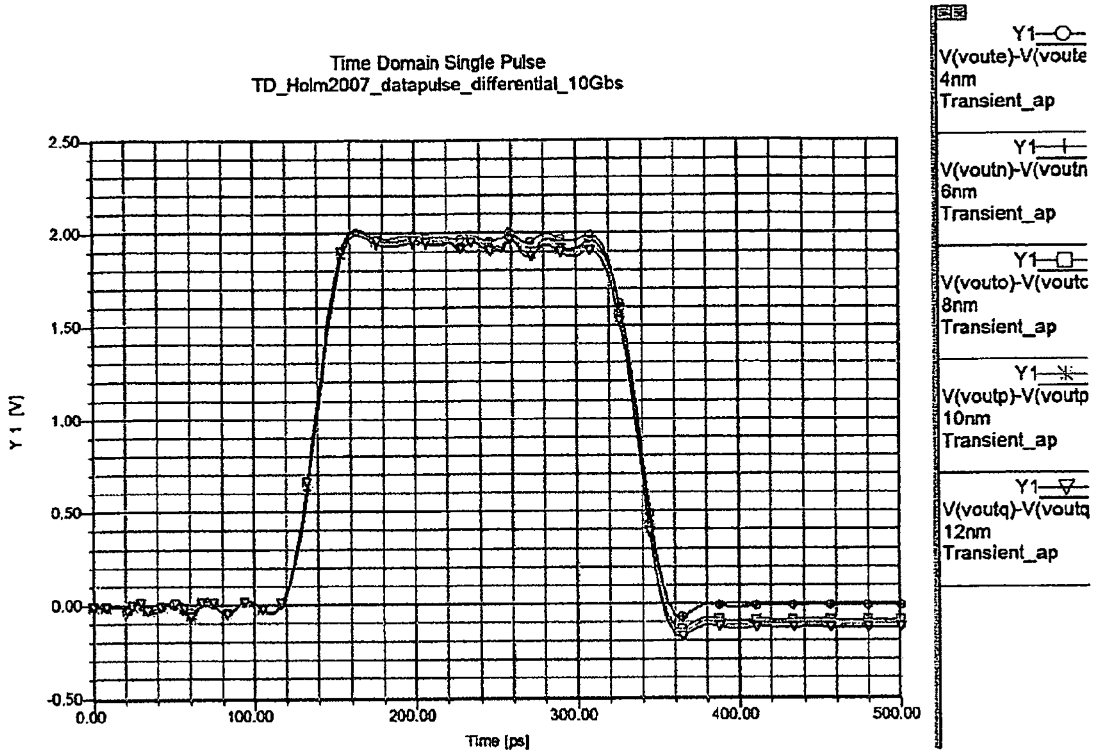
FIG. 10*a* shows the results for insertion loss in the time domain for titanium dioxide film at a variety of thickness.
Figure 10B:
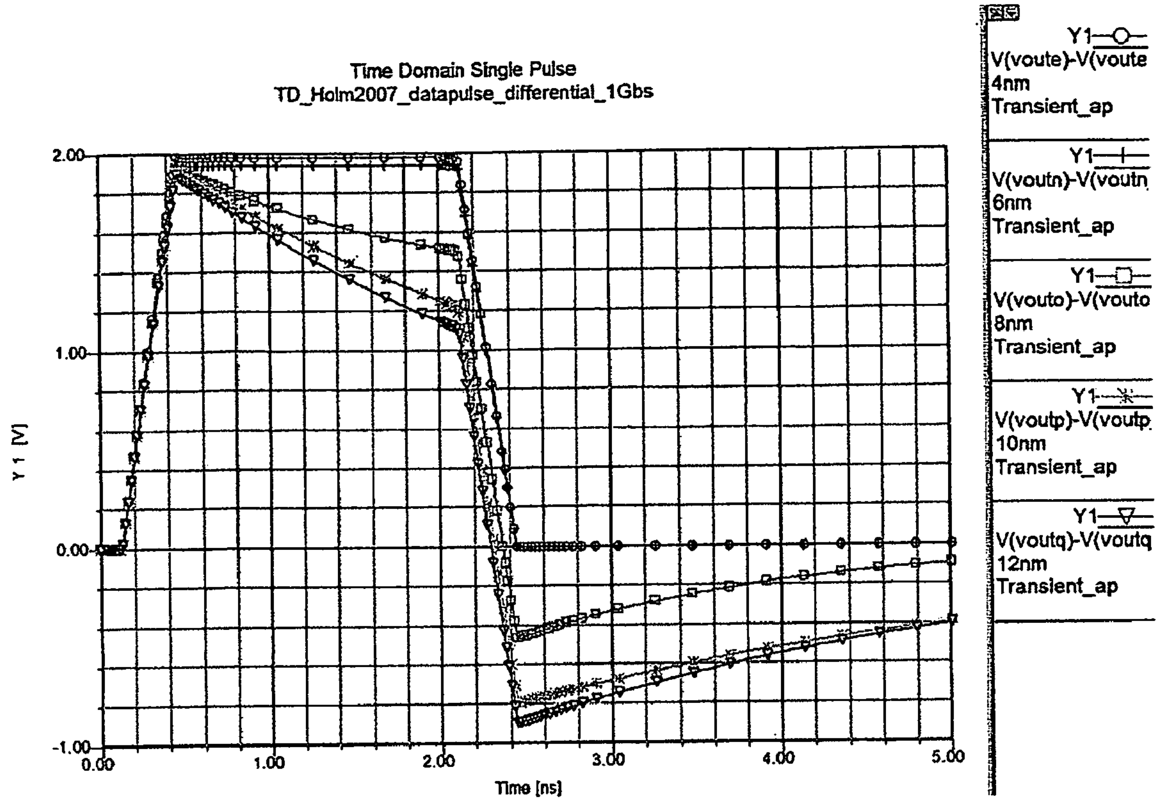
FIG. 10*b* shows the results for return loss in the time domain for titanium dioxide film at a variety of thickness.

FIGS. 10*a* and 10*b* show the impact on data transmission at 10 Gb/s single pulse and for 1 Gb/s single pulse, respectively for a 6 nm thickness $TiO_2$. As shown in FIGS. 10*a* and 10*b*, the quality and detect-ability of the signal at low data rates can be somewhat degraded and indicate that film thickness can be a factor in these results. Consequently, it is desirable to keep the film stable and resistant to change from environmental stresses or aging to provide long term reliability.

It should be understood that various changes and modifications to the embodiments described herein will be apparent to those skilled in the art. Such changes and modifications can be made without departing from the spirit and scope of the present invention and without diminishing its attendant advantages. It is, therefore, intended that such changes and modifications be covered by the appended claims.

What is claimed is:

1. A connector having a non-galvanic signal interface for carrying both high frequency signal content and low frequency signal content comprising:

a first contact for engaging with a second contact of a complementary mating connector at a predetermined contact force; and at least one of the first and second contact having a dielectric film at an area of engagement between the first and second contact such that a thickness of the dielectric film between the first and second contact at the area of engagement is a predetermined thickness for providing capacitive coupling for said high frequency signal content and allowing electronic tunneling for said low frequency signal content wherein the resistance and capacitance of the engaged first and second contact are represented by the equations $$C_f = \in_f F/2t(H+F/A_n);\text{ and}$$

$$R_f = \sigma(2t)(H/F+1A_n) \quad (5)$$

wherein $C_f$ is the capacitance, $\in_f$ is the dielectric constant of the dielectric film, 2t is the predetermined thickness, $R_f$ is the resistance, σ is the tunnel resistivity of the dielectric film having the predetermined thickness, F is the predetermined contact force, H is the micro hardness of the first contact and $A_n$ is the redetermined area of engagement.

2. The connector of claim 1 wherein the dielectric film is applied to only the first contact.

3. The connector of claim 1 wherein a first thickness of the dielectric film is applied to the first contact and a second thickness is applied to the second contact.

4. The connector of claim 3 wherein the first and second thicknesses are the same.

5. The connector of claim 1 wherein the dielectric film is selected from the group consisting of metal oxides.

6. The connector of claim 5 wherein the metal oxide is selected from the group consisting of titanium oxide, copper oxide, chromium oxide, aluminum oxide, nickel oxide and combinations thereof.

7. The connector of claim 6 wherein the dielectric film is titanium oxide.

8. The connector of claim 1 wherein the predetermined thickness is from about 1 nm to about 50 nm.

9. The connector of claim 8 wherein the predetermined thickness is from about 2 nm to about 25 nm.

10. The connector of claim 9 wherein the predetermined thickness is about 6 nm.

11. A signal connector comprising:

at least one contact having a contact interface area for engaging with a bare metal contact of a complementary connector at a predetermined contact force, the at least one contact having a dielectric film coating having a predetermined thickness at the contact interface for providing capacitive coupling for high frequency signal content and allowing electronic tunneling for low frequency signal content wherein the resistance and capacitance of the engaged at least one contact and the contact of the complementary connector are represented by the equations:

$$C_f = \in_f F/t(H+F/A_n);\text{ and}$$

$$Rf = \sigma t(H/F+1/A_n);$$

wherein $C_f$ is the capacitance, $\in_f$ is the dielectric constant of the dielectric film, t is the predetermined thickness, $R_f$ is the resistance, σ is the tunnel resistivity of the dielectric film having the predetermined thickness, F is the predetermined contact force, H is the micro hardness of the first contact and $A_n$ is the predetermined area of engagement.

12. The signal connector of claim 11 wherein the dielectric film is selected from the group consisting of metal oxides.

13. The signal connector of claim 12 wherein the metal oxide is selected from the group consisting of titanium oxide, copper oxide, chromium oxide, aluminum oxide, nickel oxide and combinations thereof.

14. The signal connector of claim 13 wherein the dielectric film is titanium oxide.

15. The signal connector of claim 11 wherein the predetermined thickness is from about 1 nm to about 50 nm.

16. The signal connector of claim 15 wherein the predetermined thickness is from about 2 nm to about 25 nm.

17. The signal connector of claim 16 wherein the predetermined thickness is about 6 nm.

18. The signal connector of claim 17 wherein high frequency signals have a frequency of at greater than or equal to 2 GHz and low frequency signals have a frequency of less than 2 GHz.

19. A connector assembly for passing signals via capacitive interface, the connector assembly comprising:

a first connector including at least one first contact for engaging at least one second contact of a second mating connector at a predetermined contact force, the first contact having a first dielectric film applied thereto and the second contact having a second dielectric applied thereto, the first dielectric having a first thickness and the second dielectric having a second thickness wherein the resistance and capacitance of the engaged first and second connectors are represented by the equations:

$$C_f = (\in_f F/(t_1+t_2)H+F/A_n);\text{ and}$$

$$Rf = (\sigma_1 t_1 + \sigma_2 t_2)(H/F+1/A_n);$$

wherein $C_f$ is the capacitance, $\in_f$ is the dielectric constant of the dielectric film, $t_1$ is the first thickness, $t_2$ is the second thickness, Rf is the resistance, $\sigma_1$ is the tunnel resistivity of the dielectric film having the first thickness, $\sigma_2$ is the tunnel resistivity of the dielectric film having the second thickness, F is the predetermined contact force, H is the micro hardness of the first and second contact and $A_n$ is the redetermined area of engagement.

20. The connector assembly of claim 19 wherein the first and second dielectric film are selected from the same material.

21. The connector assembly of claim 20 wherein the dielectric film is selected from the group consisting of metal oxides.

22. The signal connector of claim 21 wherein the metal oxide is selected from the group consisting of titanium oxide, copper oxide, chromium oxide, aluminum oxide, nickel oxide and combinations thereof.

23. The signal connector of claim 22 wherein the dielectric film is titanium oxide.

24. The signal connector of claim 19 wherein each of the first and second thickness is from about 1 nm to about 50 nm.

25. The signal connector of claim 24 wherein the each of the first and second thickness is from about 2 nm to about 25 nm.

26. The signal connector of claim 25 wherein the each of the first and second thickness is about 6 nm.

27. A method of non-galvanic signal transfer through mated connectors by capacitive coupling comprising the steps of:

providing a connector having at least a first contact for engaging with a second contact of a complementary mating connector at a predetermined contact force; and providing a dielectric film to at least one of the first and second contacts at an area of engagement between the first and second contact such that a combined thickness of the dielectric film between the first and second contact at the area of engagement has a predetermined thickness for providing capacitive coupling for said high frequency signal content and allowing electronic tunneling for said low frequency signal content wherein the resistance and capacitance of the engaged first and second contacts are represented by the equations $$C_f = \in_f F/2t(H+F/A_n);\ \text{and}$$

$$R_f = \sigma(2t)(H/F+1/A);$$

wherein $C_f$ is the capacitance, $\in_f$ is the dielectric constant of the dielectric film, 2t is the predetermined thickness, $R_f$ is the resistance, $\sigma$ (2t) is the tunnel resistivity of the dielectric film having the predetermined thickness, F is the predetermined contact force, H is the micro hardness of the first contact and $A_n$ is the redetermined area of engagement.

28. The method of non-galvanic signal transfer of claim 27 wherein the dielectric film is applied to only the first contact.

29. The method of non-galvanic signal transfer of claim 28 wherein a first thickness of the dielectric film is applied to the first contact and a second thickness is applied to the second contact.

30. The method of non-galvanic signal transfer of claim 29 wherein the first and second thicknesses are the same.

* * * * *